United States Patent [19]

Bliven

[11] Patent Number: 4,667,186
[45] Date of Patent: May 19, 1987

[54] PHASE DIFFERENCE FAULT DETECTOR

[75] Inventor: David C. Bliven, San Jose, Calif.

[73] Assignee: Raychem Corporation, Menlo Park, Calif.

[21] Appl. No.: 711,710

[22] Filed: Mar. 13, 1985

[51] Int. Cl.⁴ ............................................. G08B 21/00
[52] U.S. Cl. .................................... 340/640; 219/505; 307/87; 340/658; 340/661; 361/79
[58] Field of Search ............... 340/640, 658, 657, 661, 340/660, 664; 361/65, 77, 79, 85; 307/87, 127, 130, 131, 510; 324/83 R, 83 A, 76 R; 219/505, 504, 212

[56] References Cited

U.S. PATENT DOCUMENTS

| | | | |
|---|---|---|---|
| 2,581,196 | 1/1952 | MacPherson | 361/79 X |
| 2,854,631 | 9/1958 | Annich et al. | 361/79 X |
| 3,893,009 | 7/1925 | Watson | 307/127 X |
| 4,321,681 | 3/1982 | Sackin et al. | 361/79 X |
| 4,506,259 | 3/1985 | Rhodes | 340/640 |

FOREIGN PATENT DOCUMENTS

| | | | |
|---|---|---|---|
| 1072265 | 12/1959 | Fed. Rep. of Germany | 340/657 |
| 1444774 | 8/1976 | United Kingdom | 361/79 |
| 650153 | 2/1979 | U.S.S.R. | 361/79 |

Primary Examiner—James L. Rowland
Assistant Examiner—Daniel Myer
Attorney, Agent, or Firm—Timothy H. P. Richardson; Herbert G. Burkard

[57] ABSTRACT

Apparatus and method for monitoring a self-regulating heater comprising a PTC conductive polymer while it is being powered by a power supply signal. The apparatus is connected to a power supply and to the heater, the heater then producing a heater signal which is fed to a comparator. The comparator determines the phasal relationship between the power supply signal and the heater signal and indicates when the signals are out of phase by a predetermined magnitude.

13 Claims, 1 Drawing Figure

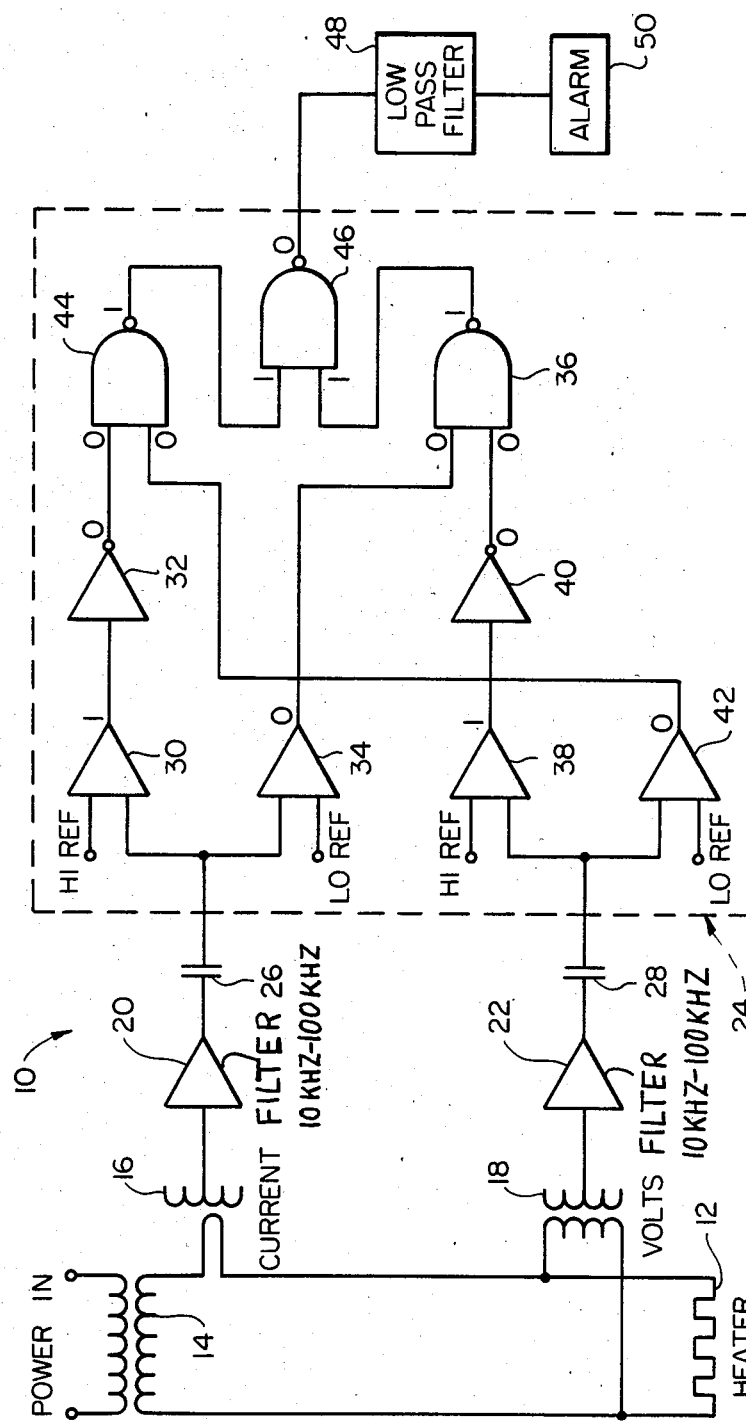

PHASE DIFFERENCE FAULT DETECTOR

BACKGROUND OF THE INVENTION

1. Field of the Invention

This invention relates to conductive polymer devices and in particular to apparatus and method for testing and detecting a fault condition in such devices.

2. Introduction to the Invention

Conductive polymer compositions exhibiting PTC behavior, and electrical devices comprising them, are well known. Reference may be made, for example, to U.S. Pat. Nos. 3,793,716, 4,177,376, 4,177,466, and 4,421,582, the disclosures of which are incorporated herein by reference.

Apparatus and method for detecting fault conditions in conductive polymer devices are known and are disclosed in commonly assigned U.S. Ser. No. 324,470 (Rhodes), now U.S. Pat. No. 4,506,259, in which a device is tested by evaluating the high frequency noise which it generates.

SUMMARY OF THE INVENTION

I have now discovered that excellent testing results for conductive polymer devices can be obtained through the use of my apparatus and method.

In one aspect, the present invention provides apparatus for detecting a fault condition in a conductive polymer device while it is being powered by a power supply signal, the apparatus comprising (1) means for connecting the apparatus to the power supply;
(2) means for connecting the apparatus to the device; and
(3) a comparator which, when the apparatus is connected to the power supply and to the device, the device then producing a device signal which is fed to the comparator,
  (a) determines the phasal relationship between the power supply signal and the device signal for signals that have a predetermined amplitude; and
  (b) indicates when the power supply signal and device signal are out of phase by a predetermined magnitude.

Preferably, the power supply signal is a voltage signal and the device signal is a current signal, although the power supply signal may be a current signal and the device signal may be a voltage signal.

The device may be, for example, a self-regulating conductive polymer heater comprising a PTC conductive polymer, and may be part of a device that is heat shrinkable. The heat may be part of a device that is heat shrinkable. The heat may be adapted to be connected to a DC or AC power supply. In the latter case, the AC power supply signal is periodic and may be, for example, sinusoidal, triangular or sawtooth. The comparator can determine the phasal relationship between the power supply signal and the device signal between a preselected portion of a 360° period, for example, 0° to 180°.

Preferably, the apparatus comprises means for disconnecting the device from the apparatus when the power supply signal and the device signal are out of phase by a predetermined magnitude, for example, at least 15 degrees.

In another aspect, the present invention provides an assembly comprising (a) a power supply;
(b) a conductive polymer device; and
(c) an apparatus comprising
  (1) means for connecting the apparatus to the power supply;
  (2) means for connecting the apparatus to the device; and
  (3) a comparator which, when the apparatus is connected to the power supply and to the device, the device then producing a device signal which is fed to the comparator,
    (a) determines the phasal relationship between the power supply signal and the device signal for signals that have a predetermined amplitude; and
    (b) indicates when the power supply signal and device signal are out of phase by a predetermined magnitude.

In another aspect, the present invention provides a method for monitoring a conductive polymer device to determine when a fault condition has occurred in the device, which method comprises (1) impressing a power signal from an external source across the device, the device then producing a device signal; and
(2) determining the phasal relationship between the power signal and the device signal.

In another aspect, the present invention provides a method for monitoring a self-regulating heater comprising a PTC conductive polymer, which method comprises (1) impressing a periodic power signal from an external power source across the heater, the heater then producing a heater signal, the power signal being a voltage signal and the heater signal being a current signal;
(2) filtering the voltage and current signals to produce filtered voltage and current signals;
(3) establishing a minimum reference magnitude of said filtered voltage and current signals;
(4) comparing said filtered voltage and current signals for phase differences within a preselected portion of the period of the power signal, but only for signals above said reference magnitude; and
(5) providing an alarm when the voltage and current signals are out of phase by a predetermined magnitude.

BRIEF DESCRIPTION OF THE DRAWING

The invention is illustrated in the accompanying drawing in which

FIG. 1 is an electrical circuit of the invention.

DETAILED DESCRIPTION OF THE INVENTION

Attention is now directed to FIG. 1 which provides an electrical circuit 10 of the invention. The circuit 10 includes a heater 12, a power supply 14, transducers 16 and 18, filters 20 and 22, and a comparator 24. Conventional components can be used for this purpose.

As indicated above, the power supply signal preferably is a voltage signal and the device signal preferably is a current signal. These signals are shown in FIG. 1 as they are developed in the primary circuit of the transducers 16 and 18 (shown as transformers) and then inputted from the secondary circuit of the transducers 16 and 18 to the filter circuits 20 and 22. The transducers 16 and 18 preferably have a capability to handle both the power supply signal, typically 60 Hz, and, a fault signal (i.e., the current signal), which may typically appear within a 10 Khz to 100 Khz spectrum. The filter circuits 20,22, on the other hand, are preferably high pass filters, but may be band pass filters having a lower pass level of at least 10 Khz and an upper pass level of at most 100 Khz.

The power supply signal and the device signal outputted by the filters 20 and 22 preferably are inputted to the comparator 24 through capacitive coupling i.e. capacitors 26 and 28. The comparator 24 comprises the following assembly:

(a) a first operational amplifier 30 that receives device signal inputs and provides a first digital logic output signal for input to a device signal inverter 32;

(b) a second operational amplifier 34 that receives device signal inputs and provides a second digital logic output signal for input to a first NAND-gate module 36;

(c) a third operational amplifier 38 that receives power supply signal inputs and provides a third digital logic output signal for input to a power supply signal inverter 40; and (d) a fourth operational amplifier 42 that receives power supply signal inputs and provides a fourth digital logic output signal for input to a second NAND-gate module 44.

The device signal inverter 32 receives the first digital logic output signal from the first operational amplifier 30 and provides an inverted first digital logic output signal for input to the second NAND-gate module 44.

The power supply signal inverter 40 receives the third digital logic output signal and provides an inverted third digital logic output signal for input to the first NAND-gate module 36.

The first NAND-gate module 36 receives the second digital logic output signal and the inverted third digital logic output signal and outputs a first module signal for input to a third NAND-gate module 46; and, the second NAND-gate module 44 receives the fourth digital logic output signal and the inverted first digital logic output signal and outputs a second module signal for input to the third NAND-gate module 46. The third NAND-gate module 46 receives the first and second module signals and outputs a third module signal which is indicative of the phasal relationship between the power supply signal and the device signal.

As indicated above, the comparator can determine the phasal relationship between the power supply signal and the device signal for signals that have a predetermined amplitude. This feature accommodates a "dead band" of noise and it works as follows. For all dead band signals having a magnitude less than a predetermined magnitude and in or out of phase, over any part of the entire 360° period of the power supply signal, the "hi" reference of operational amplifiers 30 and 38 ensures a logic 1 output while the "lo" reference of the operational amplifiers 34 and 42 ensures the logic 0 output. The outputs of the device signal inverter 32 and power supply signal inverter 40 are, accordingly, logic 0. Consequently, the logic inputs to the first and second NAND-gate modules 36 and 44 are all 0, so that their outputs are logic 1. Finally, the NAND-gate module's 36 and 38 logic 1 output provides inputs to the third NAND-gate module 46. Here, logic 1 inputs become, uniquely, a logic 0 output, thus indicating a "no-alarm" situation.

Now consider, on the other hand, the case where, over a preselected portion of a 360° period, e.g. 0°-180°, the power supply signal and the device signal are out of the dead band, but in phase (and hence in a "no alarm" situation). Here, the "hi" reference of operational amplifiers 30 and 38 ensures a logic 0 output, and the "lo" reference of the operational amplifiers 34 and 42 ensures a logic 0 output. (not shown). The outputs of the device signal inverter 32 and power supply signal inverter 40, are, accordingly, logic 1. Consequently, the logic inputs to the first and second NAND-gate modules 36 and 44 are combinations of 1's and 0's, so that their outputs are logic 1 and, finally, their inputs to the third NAND-gate module 46 become, uniquely, a logic 0 output, thus again indicating a no-alarm situation.

It follows from the preceeding description that, for the case where the power supply signal and the device signal are out of the dead band and out of phase, the output of the third NAND-gate module 46 must be a logic 1.

Although the present invention preferably employs the three NAND-gate modules 36, 44 and 46, it is possible to provide alternative, equivalent logic. For example, the NAND-gate modules 44 and 36 may be replaced by AND-gate modules, while the NAND-gate module 46 is replaced by an OR-gate module (not shown). Also, in order to enhance the sensitivity of the circuit 10, the output signal of the NAND-gate module 46 (or the OR-gate module) may be further processed by a low pass filter 48. The output of the low pass filter 48, may, in turn, be inputted to a conventional alarm circuit 50.

I claim:

1. Apparatus for detecting a fault condition in a conductive polymer device while the device is being powered by a power supply in a circuit comprising the device and the power supply, said apparatus comprising
    (1) means for connecting the apparatus to a said circuit and for generating a first signal corresponding to the current passing through the device and having a frequency in the range of 10 to 100 Khz;
    (2) means for connecting the apparatus to a said circuit and for generating a second signal corresponding to the voltage over the device and having a frequency in the range of 10 to 100 Khz; and
    (3) a comparator which, when the apparatus is connected to the circuit
        (a) determines the phasal relationship between those parts of the first and second signals that have an amplitude greater than a predetermined amplitude; and
        (b) indicates when the said parts of the first and second signals are out of phase by a predetermined magnitude.

2. Apparatus according to claim 1, which comprises a first filter which permits only a preselected portion of the first signal to reach the comparator; and a second filter which permits only a preselected portion of the second signal to reach the comparator.

3. Apparatus according to claim 1, which is adapted for use with a said circuit containing an AC power supply and wherein the comparator determines the phasal relationship between said parts of the first and second signals only during a preselected portion of a period of the AC power supply.

4. Apparatus according to claim 1, wherein the comparator comprises an assembly which comprises (a) a first operational amplifier that receives first signal inputs and provides a first digital logic output signal for input to a first signal inverter;

(b) a second operational amplifier that receives first signal inputs and provides a second digital logic output signal for input to a first NAND-gate module;

(c) a third operational amplifier that receives second signal inputs and provides a third digital logic output signal for input to a second signal inverter;

(d) a fourth operational amplifier that receives second signal inputs and provides a fourth digital logic output signal for input to a second NAND-gate module;

(e) a first signal inverter that receives the first digital logic output signal from the first operational amplifier and provides an inverted first digital logic output signal for input to the second NAND-gate module;

(f) a second signal inverter that receives the third digital logic output signal and provides an inverted third digital logic output signal for input to the first NAND-gate module;

(g) a first NAND-gate module that receives the second digital logic output signal and the inverted third digital logic output signal and outputs a first module signal for input to a third NAND-gate module;

(h) a second NAND-gate module that receives the fourth digital logic output signal and the inverted first digital logic output signal and outputs a second module signal for input to a third NAND-gate module; and (i) a third NAND-gate module that receives the first and second module signals and outputs a third module signal which is indicative of the phasal relationship between the first and second signals.

5. An assembly comprising
(a) a power supply;
(b) a conductive polymer device which is connected to the power supply; and
(c) an apparatus comprising
(1) means for generating a first signal corresponding to the current passing through the device and having a frequency in the range of 10 to 100 Khz; and
(2) means for generating a second signal corresponding to the voltage over the device and having a frequency in the range of 10 to 100 Khz;
(3) a comparator which
(a) determines the phasal relationship between those parts of the first and second signals that have an amplitude greater than a predetermined amplitude; and
(b) indicates when said parts of the first and second signals are out of phase by a predetermined magnitude.

6. A method for monitoring a conductive polymer device, while it is connected to a power supply, to determine when a fault condition has occured in said device, which method comprises
determining the phasal relationship between (a) the components of the current passing through the device which have a frequency of 10 to 100 Khz, and (b) the components of the voltage over the device which have a frequency of 10 to 100 Khz.

7. A method acording to claim 6, which comprises determining the phasal relationship between only those parts of the first and second signals having a frequency in a predetermined frequency band.

8. A method according to claim 6, wherein only signals having a magnitude greater than a predetermined magnitude are examined.

9. A method according to claim 6, wherein the device is a self-regulating heater comprising a PTC conductive polymer.

10. A method according to claim 6 wherein the power supply is an AC power supply.

11. A method according to claim 10 wherein the comparator determines the phasal relationship between the first and second signals during a preselected portion of a period of the power supply.

12. A method according to claim 10 wherein the AC power supply has a frequency of about 60 hz.

13. A method according to claim 6 wherein the device is a heat-shrinkable conductive polymer device and the comparator compares the first and second signals as the device is heated by passage of current through the conductive polymer and the device shrinks as a result of such heating.

* * * * *

UNITED STATES PATENT AND TRADEMARK OFFICE
CERTIFICATE OF CORRECTION

PATENT NO. : 4,667,186

DATED : May 19, 1987

INVENTOR(S) : David C. Bliven

It is certified that error appears in the above-identified patent and that said Letters Patent is hereby corrected as shown below:

In Column 1, line 13, delete "4,177,466" and insert --4,177,446--.

In Column 1, lines 53 to 54, delete from "The heat may" to "heat shrinkable".

In Claim 6, line 6, after "components of" insert --a first signal corresponding to--.

In Claim 6, line 8, after "components of" insert --a second signal corresponding to--.

Signed and Sealed this

Twenty-sixth Day of July, 1988

Attest:

DONALD J. QUIGG

*Attesting Officer*   *Commissioner of Patents and Trademarks*